United States Patent
Venes et al.

(10) Patent No.: US 6,362,758 B1
(45) Date of Patent: Mar. 26, 2002

(54) COMBINED INPUT CIRCUIT FOR ANALOG TO DIGITAL CONVERSION

(75) Inventors: Arnoldus G. W. Venes, Aliso Viejo, CA (US); Rudy J. Van De Plassche, Waalre (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/244,839

(22) Filed: Feb. 2, 1999

(30) Foreign Application Priority Data

Feb. 3, 1998 (EP) .............................. 98200317

(51) Int. Cl.⁷ ................................................ H03M 1/00
(52) U.S. Cl. ...................................... 341/122; 327/335
(58) Field of Search .............................. 341/122, 144, 341/155; 327/335, 355, 392

(56) References Cited

U.S. PATENT DOCUMENTS

| | | | |
|---|---|---|---|
| 4,763,107 A | 8/1988 | Koen et al. | 340/347 |
| 4,831,379 A | 5/1989 | Van De Plassche | 341/156 |
| 4,890,107 A | 12/1989 | Pearce | 341/156 |
| 5,410,274 A | * 4/1995 | Birdsall et al. | 330/265 |
| 5,552,784 A | * 9/1996 | Evans | 341/122 |
| 5,706,008 A | * 1/1998 | Huntley, Jr. et al. | 341/156 |
| 5,744,985 A | * 4/1998 | Nishida | 327/94 |
| 5,831,562 A | * 11/1998 | Van Auken et al. | 341/122 |

OTHER PUBLICATIONS

"Fully Bipolar, 120–MSAMPLE/S 10–b Track and Hold Circuit", By Pieter Vorenkamp et al., IEEE Journal of Solid–State Circuits, vol. 27, No. 7, Jul. 1992, pp. 988–992.

* cited by examiner

Primary Examiner—Peguy Jeanpierre

(57) ABSTRACT

An input circuit for, for example, an A/D converter mainly determines the performance of the circuit preceded by the input circuit (A/D converter). To improve the performance of the input circuit and to overcome the problem of high-power dissipation at the same time, the invention proposes the use of a combined sampling means and sub-ranging means as an input circuit.

6 Claims, 4 Drawing Sheets

COMBINED INPUT CIRCUIT FOR ANALOG TO DIGITAL CONVERSION

BACKGROUND OF THE INVENTION

The invention relates to an input circuit for, for example, an A/D converter. Such an input circuit can be used in a video data acquisition and conversion chain incorporating the A/D converter.

The invention also relates to an A/D converter, a receiver, a multimedia apparatus and an information read-out arrangement.

The article "Fully Bipolar, 120-Msample/s 10-b Track-and-Hold Circuit" by P. Vorenkamp and J. P. M. Verdaasdonk, IEEE JSSC, Vol. 27, No. 7, July 1992, pp. 988–992 describes a prior-art input circuit to be used in a video data acquisition and conversion chain. The analog video input signal is filtered and fed into a track-and-hold (T/H) circuit which carries out a sampling operation. The sampled analog video signal is fed into a data conversion and processing module consisting of an A/D converter, a digital signal processor (DSP), and a digital-to-analog (D/A) converter. The cited article mentions that the T/H circuit, which is used as a presampler in front of the A/D converter, improves the high-frequency performance of the A/D converter. Generally, if a sampling circuit is placed in front of a signal processor, the sampling circuit should have a performance which is commensurate with that of the signal processor. If the signal processor has a relatively high performance, in the case of, for example, a high-resolution A/D converter, the sampling circuit will be relatively complex and hence costly. If, in addition, the sampling circuit has to cope with high-frequency input signals, it will consume an appreciable amount of power.

U.S. Pat. 4,831,379 describes a prior-art A/D converter. The prior-art A/D converter comprises an array of 64 input amplifiers. Assuming that i is an integer ranging from 0 to 63, each amplifier Ai amplifies the difference between an analog input voltage and a corresponding reference voltage VRi to produce an amplified output voltage VAi. The amplified output voltages VA0–VA63 are processed in a folding array and an interpolation circuit to produce complementary signals VD0/VDN0. VD31/VDN31, from which signals an output circuit derives a digital output code. A signal processor may comprise a conversion circuit which converts an input signal into sub-ranging signals associated with different amplitude sub-ranges. The above-identified prior-art A/D converter is such a signal processor. In the prior-art A/D converter, the array of 64 input amplifiers converts the input signal into 64 sub-ranging signals, namely the amplified output voltages VA0. VA63. Each of the amplified output voltages VA0. VA63 is associated with an amplitude sub-range centered around the respective reference voltages VR0–VR63. A disadvantage of this known converter is that it has a high power dissipation to obtain the output voltages VA0–VA63.

SUMMARY OF THE INVENTION

The invention seeks, inter alia, to provide an input circuit for an A/D converter which, with respect to the prior art, has less power dissipation and a low harmonic distortion. To this end, a first aspect of the invention provides an input circuit. A second aspect of the invention provides an A/D converter Third, fourth and fifth aspects of the invention provide a receiver, a multimedia apparatus and an information read-out arrangement.

The invention takes the following aspects into consideration.

By combining the sub-ranging means with the output stage of the sampling means, power dissipation is substantially reduced.

By using the sub-ranging means, the high-frequency performance is also improved.

An embodiment of an input circuit according to the invention combines the resistor ladder of the sub-ranging means with the resistor (ladder) of the output stage, the power dissipation is reduced.

An embodiment of an input circuit according to the invention is an input circuit with complementary input signals decreases the sensitivity of the A/D converter to interfering signals.

The invention and additional features which may be optionally used to implement the invention to advantage will be apparent from and elucidated with reference to the examples described hereinafter and shown in the Figures.

DESCRIPTION OF THE PREFERRED EMBODIMENT

Figure 1:
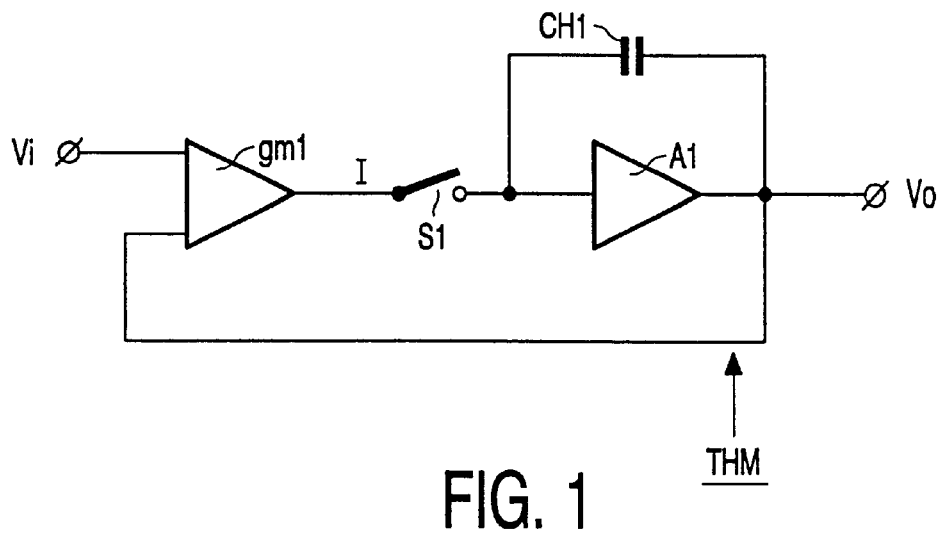
FIG. 1 shows prior-art sample-and-hold means.

FIG. 1 shows an example of a known single-ended sample-and-hold means in the form of a track-and-hold means implementation THM. An input voltage Vi is supplied to a transconductor gml, which converts the input voltage into a current I. This current I is supplied via a switch S1 to the capacitor CH1 which stores the charge as an integration of the current. At the output of the track-and-hold means THM, a sampled voltage is available across the capacitor CH1. This track-and-hold circuit can be used to sample an analog video input signal Vi. The sampled analog video signal will be fed to, for example an A/D converter. By using such a presampler in front of an A/D converter the high-frequency performance of the A/D converter is improved. The sampling circuit should have a performance which is commensurate with that of the A/D converter concerned.

Figure 2:
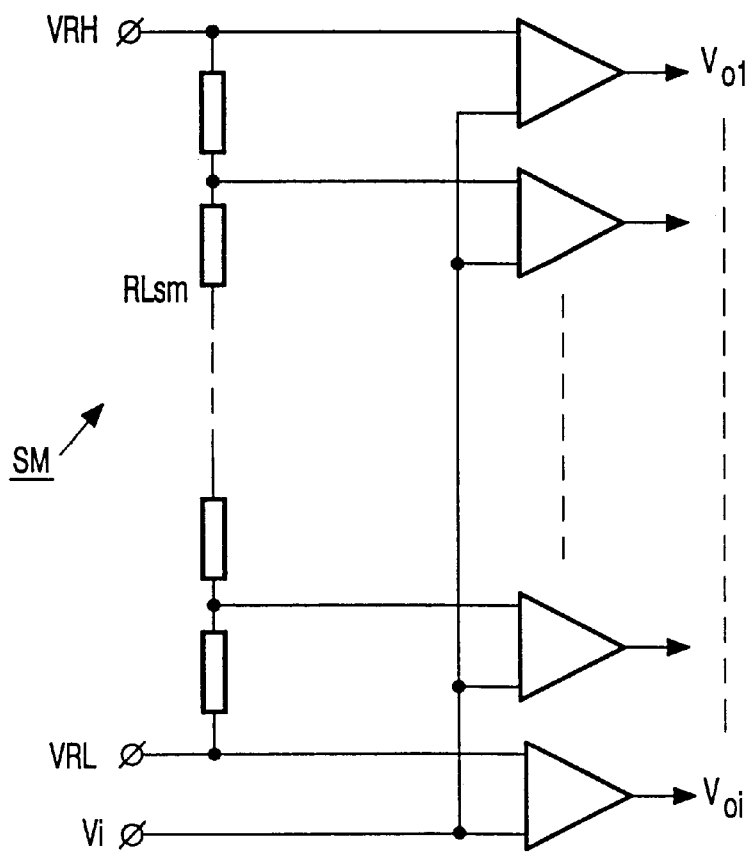
FIG. 2 shows prior-art sub-ranging means.

FIG. 2 shows an example of a known single-ended input circuit SM for, for example, an A/D converter. Herein, input voltage Vi, for example a video signal, is converted into sub-ranging signals associated with different amplitude sub-ranges Vo1–Voi. By sub-ranging the input signal using a resistor ladder RLsm before the signal is supplied to an A/D converter, the amplifiers of the A/D converter do not have to amplify the complete amplitude range but only a small part thereof. This results in a better performance.

Figure 3:
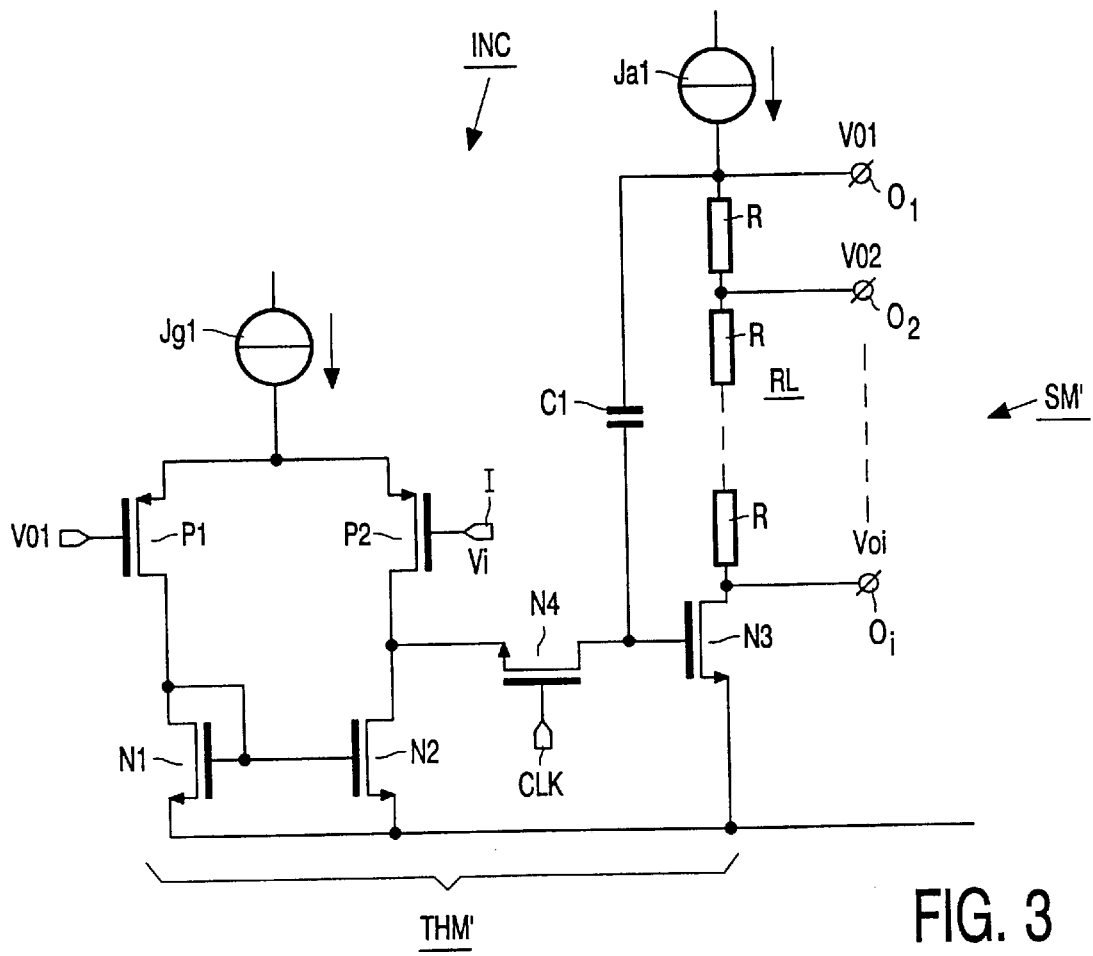
FIG. 3 shows, in a block, form a basic example of an input circuit for an A/D converter according to the invention.

FIG. 3 shows, in a block form, a basic example of an input circuit INC for, for example, an A/D converter according to the invention. Herein, the sample-and-hold means THM (see FIG. 1) and part of the sub-ranging means SM (see FIG. 2) are combined. The sub-ranging means SM' of the input circuit INC is part of the output stage of the sample-and-hold means THM'. At an input I, the input circuit, for example for an A/D converter receives a voltage Vi. This input voltage is amplified (converted to a current) with the transistors P2, P1, N1 and N2. Via a switch N4, which is switched according to a clock signal CLK and the output stage of the sampling means THM' supplies output voltages Vo1–Voi at outputs O1–Oi. The holding operation is performed with the capacitor C1 which is placed between the gate electrode of the output transistor N3 of the sampling means THM' and the output O1. To obtain the different output voltages Vo1–Voi, a resistor ladder RL comprising resistors R is placed between the outputs O1–Oi. The output Oi is coupled to the output transistor N3 of the sampling means THM'. The input circuit INC further comprises two current sources Jg1 and Ja1 to obtain the requested operation of the transistors and voltage differences across the resistor ladder RL.

In this example the gate of the transistor P1 is coupled to the output O1. The voltage Vo1 will thus also be present at this gate during operation. In this way, a feedback coupling is achieved. Those skilled in the art will be aware many alternatives to achieve a feedback between (one of) the outputs with an input. For example, a resistor may be incorporated in the feedback loop.

Figure 4:
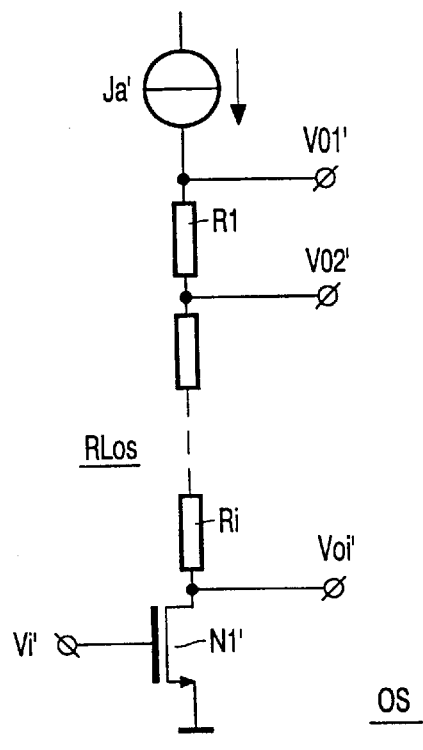
FIG. 4 shows an output stage having a sub-ranging resistor ladder.

FIG. 4 shows an output stage OS having a resistor ladder RLos comprising resistors R1–Ri. This output stage also comprises a current source Ja' and a transistor Ni'. In operation, the gate of the transistor Ni' receives an input voltage Vi' which voltage is amplified by the transistor Ni' and outputted as output voltages Vo1'–Voi' at the interconnections and at the upper and lower end of the resistor ladder RLos. Such an output stage without the resistor ladder is known per se and can be used as output stage of the sampling means THM' as shown in FIG. 3. By using this kind of output stage, the resistor ladder of the sub-ranging means RLsm (see FIG. 1) and the resistor ladder of the output stage RLos (see FIG. 3) can be combined as is done in an example of the input circuit according to the invention and shown in FIG. 3 (RL).

Figure 5:
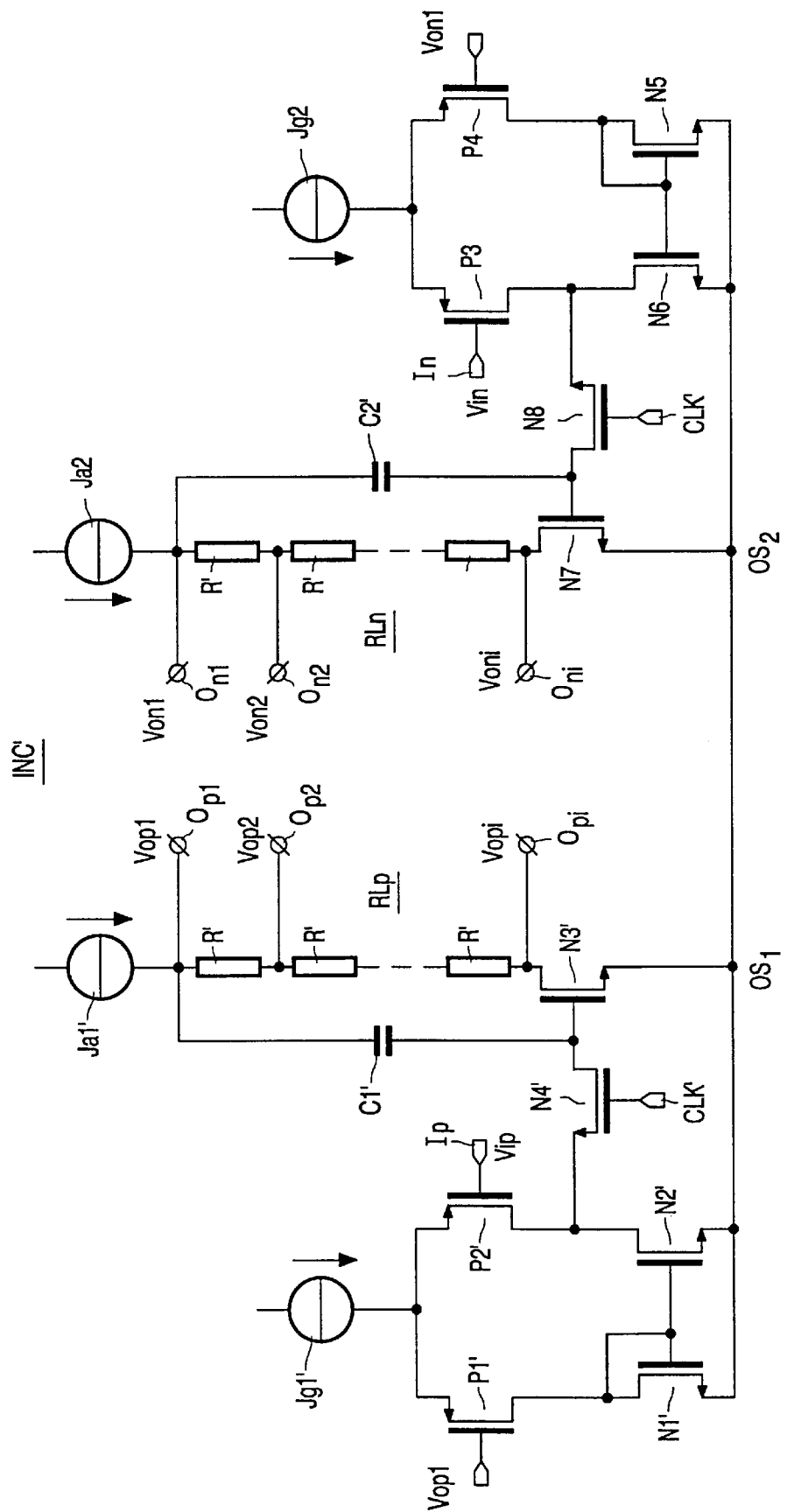
FIG. 5 shows, in a block form, an example of a differential input circuit for an A/D converter according to the invention.

FIG. 5 shows, in a block form, an example of a differential input circuit INC' for, for example, an A/D converter according to the invention. Elements corresponding to those in FIG. 3 have corresponding reference signs. To further improve the performance of the input circuit, the input circuit will be preferably designed as a differential input circuit. A differential input circuit has the following advantages compared with a single-ended input circuit (FIG. 3).

Differential implementation decreases sensitivity of the A/D converter to interfering signals.

The required input voltage range is reduced by a factor 2, or lower supply voltages may be used.

In operation, the input circuit INC' receives a differential input signal Vip and Vin, for example a video signal at inputs Ip and In . These input signals Vip and Vin are amplified with the transistors P1', P2', Ni', and N2', P3, P4, N5, and N6, respectively. Via switches N4' and N8 under the control of a clock signal CLK', these amplified signals are transferred to the output stages OS1 and OS2. These output stages each comprise a resistor ladder RLp and RLn, respectively with resistors R'. Each output stage has an output transistor N3 and N7, respectively. To sample the signals, each output stage OS1, OS2 comprises a capacitor C1', C2'. At outputs O1p–Oip, the input circuit supplies output voltages Vop1–Vopi, and at outputs Oln–Oin, the input circuit supplies output voltages Von1–Voni. Similarly as in FIG. 3, this input circuit INC' further comprises current sources Jg1', Ja1' and Jg2, Ja2 to obtain the requested operation of the transistors and the required voltage differences across the resistor ladders RLp and Rln.

Figure 6:
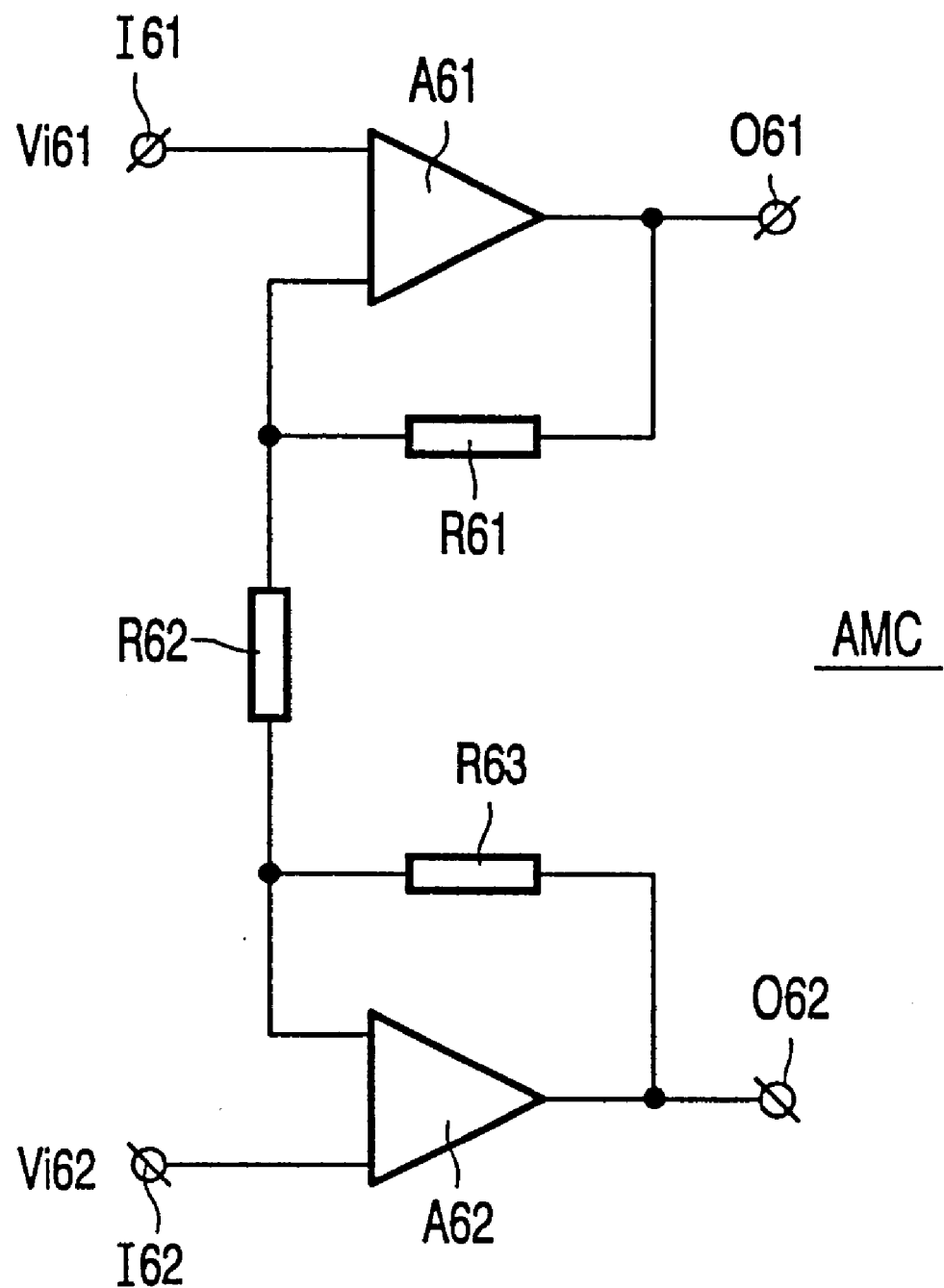
FIG. 6 shows a basic example of a differential amplifying circuit with a feedback loop.

Similarly as in FIG. 3, the feedback loop has not been shown but the voltages Vop1 and Von1 are available at the gate of P1', P4 respectively by coupling these gates to outputs Op1, On1 respectively. As described above, one or more resistors in these feedback loops can be coupled to obtain requested feedback responses. FIG. 6 shows the feedback loop in greater detail.

In FIG. 6, an amplifying circuit AMC is shown, having two inputs I61, I62 and two outputs O61, O62. At each input, input signals Vi61 and Vi62, are respectively supplied and amplified by the amplifiers A61 and A62. The input signals may be of a complementary nature. The feedback loops comprise resistors R61, R62 and R63, with resistor R62 influencing the common phase/differential phase behavior of the amplifying circuit.

When the resistor R62 is chosen to be infinite (i.e. no connection) and the resistors R61 and R63 are chosen to be zero, the simplest feedback loop, shown in FIG. 5, is obtained.

The invention has been described on the basis of some examples. Those skilled in the art will be well aware of many alternatives which fall within the scope of the present invention.

This combined input circuit in which the sub-ranging means are part of the output stage of the sampling means may be used in not intended applications as an input circuit for an A/D converter. This input circuit may also be used in a receiver for receiving audio and/or video signals, a multimedia apparatus and/or in an information read-out arrangements.

The A/D converter may also be used in for example a receiver for receiving RF-AM, RF-FM and/or TV-IF signals.

What is claimed is:

1. An input circuit for an A/D converter, characterized in that the input circuit comprises:

sampling means for sampling an input signal and supplying a sampled signal at an output stage, and sub-ranging means for converting the sampled signal into sub-ranging signals, the sub-ranging means being part of the output stage of the sampling means, wherein the output stage of the sampling means comprises a resistor ladder which also forms part of the sub-ranging means, wherein a time-signaled switch connects the sampling means and the sub-ranging means, wherein the input circuit is a differential input circuit having first sampling means and first sub-ranging means for receiving and handling a first input signal and second sampling means and second sub-ranging means for receiving and handling a second input signal, the first and the second input signal being complementary.

2. An A/D converter having an input circuit as claimed in claim 1.

3. A receiver for receiving audio and/or video signals, having an A/D converter as claimed in claim 2.

4. A multimedia apparatus having an A/D converter as claimed in claim 2.

5. An information read-out arrangement having an A/D converter as claimed in claim 2.

6. A receiver for receiving RF-AM, RF-FM and/or TV-IF signals, having an A/D converter as claimed in claim 2.

* * * * *